United States Patent
Kira et al.

(10) Patent No.: US 6,240,634 B1
(45) Date of Patent: Jun. 5, 2001

(54) METHOD OF PRODUCING A MULTICHIP PACKAGE MODULE IN WHICH ROUGH-PITCH AND FINE-PITCH CHIPS ARE MOUNTED ON A BOARD

(75) Inventors: Hidehiko Kira; Kenji Kobae; Norio Kainuma; Naoki Ishikawa; Satoshi Emoto, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/460,727

(22) Filed: Dec. 14, 1999

Related U.S. Application Data

(63) Continuation of application No. 09/026,490, filed on Feb. 19, 1998, now Pat. No. 6,006,426.

(30) Foreign Application Priority Data

Sep. 12, 1997 (JP) .................................................. 9-248988

(51) Int. Cl.[7] .................................................. H05K 3/30
(52) U.S. Cl. ................ 29/836; 29/832; 29/840; 29/740; 228/180.21
(58) Field of Search ............................. 29/832, 740, 840, 29/836; 228/180.21

(56) References Cited

U.S. PATENT DOCUMENTS

| | | | |
|---|---|---|---|
| 3,216,496 | 11/1965 | Katz et al. | 165/185 |
| 4,763,405 | 8/1988 | Morita et al. | 29/740 |
| 4,878,991 | * 11/1989 | Eichelberger et al. | |
| 4,918,811 | * 4/1990 | Eichelberger et al. | |
| 5,091,769 | * 2/1992 | Eichelberger . | |
| 5,149,662 | * 9/1992 | Eichelberger . | |
| 5,394,609 | 3/1995 | Ferguson et al. | 29/840 |
| 5,439,161 | 8/1995 | Kawatami et al. | 228/180.21 |
| 5,482,200 | 1/1996 | Myers et al. | 228/191 |
| 5,526,875 | 6/1996 | Lin | 165/80.3 |
| 5,666,064 | 9/1997 | Kasai et al. | 324/755 |
| 5,821,627 | 10/1998 | Mori et al. | 257/780 |
| 5,894,982 | 4/1999 | Hasegawa et al. | 228/106 |
| 6,051,878 | * 4/2000 | Akram et al. . | |

FOREIGN PATENT DOCUMENTS

| | | |
|---|---|---|
| 295 12 677 U1 | 12/1995 | (DE) . |
| 0 572 326 A2 | 12/1993 | (EP) . |
| 0 614 330 A1 | 9/1994 | (EP) . |
| 0 673 066 A1 | 9/1995 | (EP) . |
| 2 287 837 | 9/1995 | (GB) . |
| 60-050948 | 3/1985 | (JP) . |

OTHER PUBLICATIONS

Tom Lee T Y et al.—"Compact Liquid Cooling System for Small, Moveable Electronic Equipment" IEEE—vol. 15, No. 5, Oct. 1, 1992—pp. 786–793.

* cited by examiner

*Primary Examiner*—Carl J. Arbes
(74) *Attorney, Agent, or Firm*—Armstrong, Westerman, Hattori, McLeland & Naughton, LLP

(57) ABSTRACT

In a method of production of a multichip package module, rough-pitch bare chips are positioned at first locations on a printed-circuit board, and the rough-pitch bare chips are temporarily attached to the board at the first locations. The rough-pitch bare chips are mounted on the board at the same time by applying heat and pressure to the rough-pitch bare chips simultaneously. A respective one of fine-pitch bare chips is positioned at a respective one of second locations on the board other than the first locations, and the respective one of the fine-pitch bare chips is mounted on the board by applying heat and pressure to the fine-pitch bare chips individually, in order to produce the multichip package module.

17 Claims, 8 Drawing Sheets

METHOD OF PRODUCING A MULTICHIP PACKAGE MODULE IN WHICH ROUGH-PITCH AND FINE-PITCH CHIPS ARE MOUNTED ON A BOARD

This application is a continuation of 09/026,490 filed Feb. 19, 1998 now U.S. Pat. No. 6,006,426.

BACKGROUND OF THE INVENTION (1) Field of the Invention

The present invention relates to a method of production of a multichip package module in which rough-pitch semiconductor chips and fine-pitch semiconductor chips in combination are mounted on a printed-circuit board.

(2) Description of the Related Art

Portable electronic devices employ a multiple semiconductor chip package module in which various semiconductor chips are contained on a printed-circuit board. Currently, there is an increasing demand to make the portable electronic devices as small as possible in size. To keep up with this demand, it is needed to increase the board density as much as possible and make the board smaller in size.

In order to facilitate mounting of bare chips on a printed-circuit board in which the bare chips are densely packed, development of a flip-chip bonding technique has become prevalent. By using the flip-chip bonding technique, the bare chips can be easily bonded to the densely packed board, and little space around the board is required. The flip-chip bonding technique is a type of thermocompression connection, and it does not use a soldered joint which causes the problem of a lead (Pb) alloy detrimental to the environment.

FIG. 1A through FIG. 1C show a conventional method of production of a multichip package module.

In the conventional production method, shown in FIG. 1A, an adhesive 3 is applied to locations for bare chips on a printed-circuit board 1 (which will be called the board 1) in an assembly line. The board 1 is transported to a vacuum head 41A in the assembly line. By using the vacuum head 41A, as shown in FIG. 1B, a plurality of bare chips 2-1, 2-2, 2-3, and 2-4 (which are semiconductor chips before mounting) are individually positioned at the locations of the adhesive 3 on the board 1. The vacuum head 41A applies a compressive force to one of the bare chips 2-1 through 2-4 against the board 1 individually, so that the bare chips 2-1 through 2-4 are temporarily attached to the board 1.

After the bare chips 2-1 through 2-4 are temporarily attached to the board 1, the board 1 is transported to a multichip mounting machine 42A in the assembly line. The multichip mounting machine 42A has a plurality of thermocompression heads actuated by springs as shown in FIG. 1C. The thermocompression heads of the multichip mounting machine 42A simultaneously apply heat and pressure to all the bare chips 2-1 through 2-4 on the board 1 for about 100 seconds at a time.

In the conventional production method, the mounting of all the bare chips 2-1 through 2-4 on the board 1 is carried out at the same time by using the multichip mounting machine 42A. The use of the multichip mounting machine 42A in the conventional production method increases a productivity of multichip package modules.

However, the above-described conventional production method tends to cause misalignment of the positions of the mounted chips to the board during the transporting of the board with the bare chips temporarily attached or when the compressive force by the multichip mounting machine is simultaneously exerted on the plurality of bare chips against the board. It is difficult for the conventional production method to ensure a sufficient level of quality of the multichip package module.

Generally, the bare chips to be mounted on a single printed-circuit board include a fine-pitch bare chip (such as a microprocessor chip) and a plurality of rough-pitch bare chips (such as semiconductor chips other than a microprocessor chip) per board. Fine-pitch bare chips have a relatively small pitch between stud bumps, and rough-pitch bare chips have a relatively large pitch between studs bumps. Further, fine-pitch bare chips are expensive, and rough-pitch bare chips are less expensive.

Tolerances of the positions of the bare chips mounted on the printed-circuit board in the multichip package module vary depending on the type of the bare chips. The tolerance for the fine-pitch bare chip is relatively small, and the tolerance for the rough-pitch bare chips is relatively large.

If misalignment of the positions of the mounted chips to the board has occurred, it is very difficult to compensate for the misalignment. Such a module is rejected in an inspection process as a defective product during a testing step. Since the tolerance for the fine-pitch bare chip is relatively small, the stud bumps of the fine-pitch bare chip are likely to be separated from or erroneously connected to electrodes of the board due to the misalignment. This may cause a break or a short circuit in the electric connections between the chip and the board. As a result, the multichip package module yield will be decreased due to the misalignment.

Therefore, when the rough-pitch bare chips and the fine-pitch bare chips in combination are mounted on the board, it is difficult for the conventional production method to prevent the occurrence of misalignment of the positions of the mounted chips to the board so as to ensure a good productivity.

In addition, a single-chip mounting technique using a single-chip mounting machine is also known. In a case of the single-chip mounting technique, the single-chip mounting machine applies heat and pressure to one of the bare chips against the printed-circuit board, and the bare chips are individually mounted on the board. Misalignment of the positions of the mounted chips to the board hardly occurs when the compressive force by the mounting machine is exerted on a respective one of the bare chips. However, the single-chip mounting technique requires a significantly long time to carry out the mounting of all the bare chips on the board since it takes about 100 seconds for the single-chip mounting machine to apply heat and pressure to each of the bare chips.

SUMMARY OF THE INVENTION

An object of the present invention is to provide an improved method of production of a multichip package module in which the above-mentioned problems are eliminated.

Another object of the present invention is to provide a multichip package module production method which is effective in preventing the misalignment of the positions of the mounted chips to the printed-circuit board while providing an increased productivity, in a case in which a multichip package module wherein the rough-pitch bare chips and the fine-pitch bare chips in combination are mounted on the board is produced by using the flip-chip bonding technique.

The above-mentioned objects of the present invention are achieved by a method of production of a multichip package module, which comprises the steps of: positioning the rough-pitch bare chips at first locations on the board and temporarily attaching the rough-pitch bare chips to the board at the first locations; mounting the rough-pitch bare chips on the board at the same time by applying heat and pressure to the rough-pitch bare chips simultaneously; and positioning a respective one of the fine-pitch bare chips at a respective one of second locations on the board other than the first locations, and mounting the respective one of the fine-pitch bare chips on the board by applying heat and pressure to the fine-pitch bare chips individually, in order to produce the multichip package module.

In the multichip package module production method of the present invention, the rough-pitch bare chips are first mounted on the board simultaneously by controlling a multichip mounting machine. Then, the fine-pitch bare chips are individually mounted on the board by controlling a single-chip mounting machine, so that a multichip package module in which all the chips are mounted on the board is produced. The tolerance for the rough-pitch bare chips is relatively large, and the multichip mounting of the present invention is effective in reducing the misalignment of the positions of the mounted chips to the board. Thus, it is possible to provide an increased productivity in comparison with that of the conventional production method in which all the bare chips are mounted on the board at the same time by performing the multichip mounting.

Further, in the multichip package module production method of the present invention, an intermediate product after the multichip mounting step is performed is tested to determine whether the intermediate product is accepted or rejected. The single-chip mounting is performed for only the accepted intermediate product. The fine-pitch bare chips are expensive, and the rough-pitch bare chips are less expensive. It is possible to avoid performing the single-chip mounting step for the rejected intermediate product which may include the misalignment of the positions of the mounted chips to the board.

It is useless performing the mounting of the fine-pitch bare chips for the rejected intermediate product, and the cost of the fine-pitch bare chips saved by avoiding the performance of the single-chip mounting for the rejected intermediate product is significantly high. Therefore, the production method of the present invention is effective in providing an increased productivity in comparison with that of the conventional production method.

BRIEF DESCRIPTION OF THE DRAWINGS

The above and other objects, features and advantages of the present invention will become more apparent from the following detailed description when read in conjunction with the accompanying drawings in which.

DETAILED DESCRIPTION OF THE PREFERRED EMBODIMENT

To facilitate understanding of the present invention, a brief description will be given of a representative multichip package module, with reference to FIG. 6 through FIG. 8.

Figure 6:
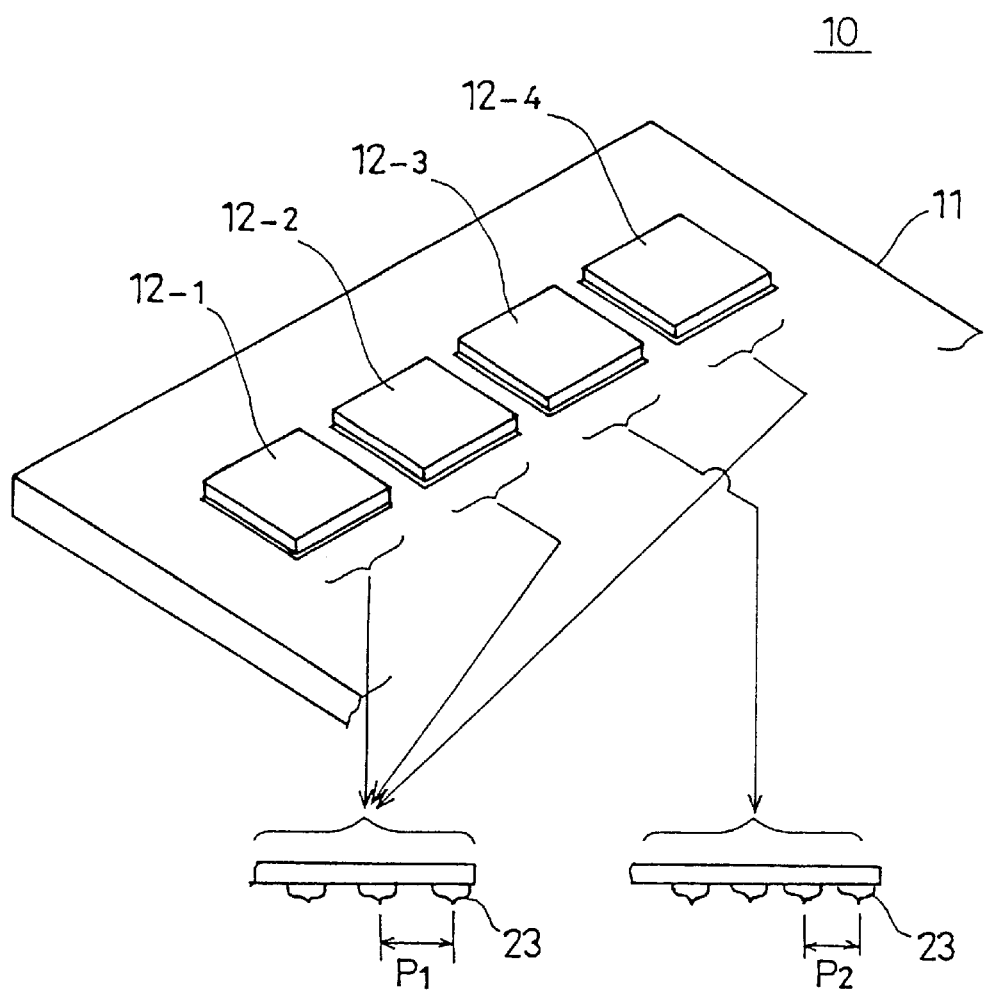
FIG. 6 is a diagram for explaining a construction of a representative multichip package module.

FIG. 6 shows a construction of a representative multichip package module 10 which is produced by using a flip-chip bonding technique.

As shown in FIG. 6, the multichip package module 10 includes a plurality of bare chips 12-1, 12-2, 12-3 and 12-4 mounted on a printed-circuit board 11. Of the bare chips mounted on the board 11, the bare chips 12-1, 12-2 and 12-4 are called the rough-pitch bare chips, and the bare chip 12-3 is called the fine-pitch bare chip. The fine-pitch bare chip 12-3 has a relatively small pitch "P2" between stud bumps 23, and the rough-pitch bare chips 12-1, 12-2 and 12-4 have a relatively large pitch "P1" between studs bumps 23. Further, the fine-pitch bare chip 12-3 is expensive, and the rough-pitch bare chips 12-1, 12-2 and 12-4 are less expensive.

By using the flip-chip bonding technique, the bare chips 12-1 through 12-4 can be easily bonded to the board 11, and little space around the board 11 is required. The flip-chip bonding technique is a type of thermocompression connection, and it does not use a soldered joint.

Figure 7:
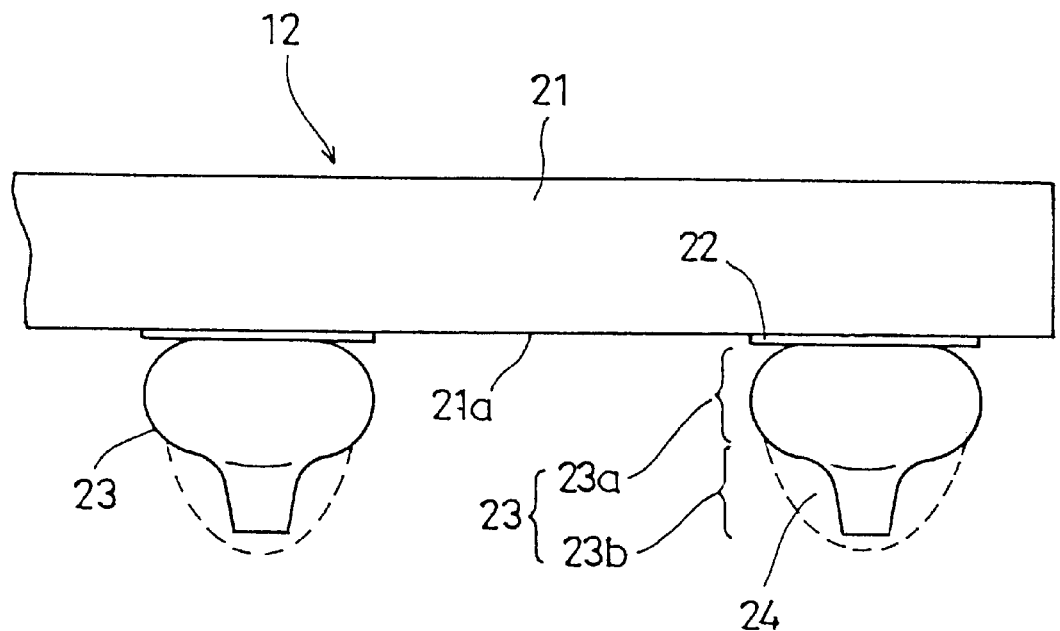
FIG. 7 is a diagram of one of bare chips to be contained in the multichip package module of FIG. 6 before the bare chip is mounted on a board.

FIG. 7 shows one of the bare chips to be contained in the multichip package module 10 before the bare chip is mounted on the board 11. In FIG. 7, for the purpose of illustration, an enlarged view of a portion of the multichip package module 10 is given.

As shown in FIG. 7, the bare chip 12, indicated as one of the bare chips 12-1 through 12-4, includes a substrate 21 having a bottom surface 21a. A plurality of electrodes 22 are provided on the bottom surface 21a, and the electrodes 22 are made of aluminum (Al). The stud bumps 23 are respectively provided on the electrodes 22, and the stud bumps 23 are made of gold (Au). Each of the stud bumps 23 has a base portion 23a bonded to a corresponding electrode 22, and a leg portion 23b extending downwardly from the base portion 23a. The base portion 23a is in the form of a flattened sphere, and the leg portion 23b is in a generally cylindrical shape. Further, a conductive adhesive 24 is attached to each of the stud bumps 23, and the leg portion 23b of each of the stud bumps 23 is enclosed in the conductive adhesive 24. The conductive adhesive 24 is made of an epoxy resin containing a silver (Ag) filler. In the above-described bare chip 12, the stud bumps 23 and the conductive adhesive 24 do not contain a lead (Pb) alloy as contained in a soldered joint.

Figure 8:
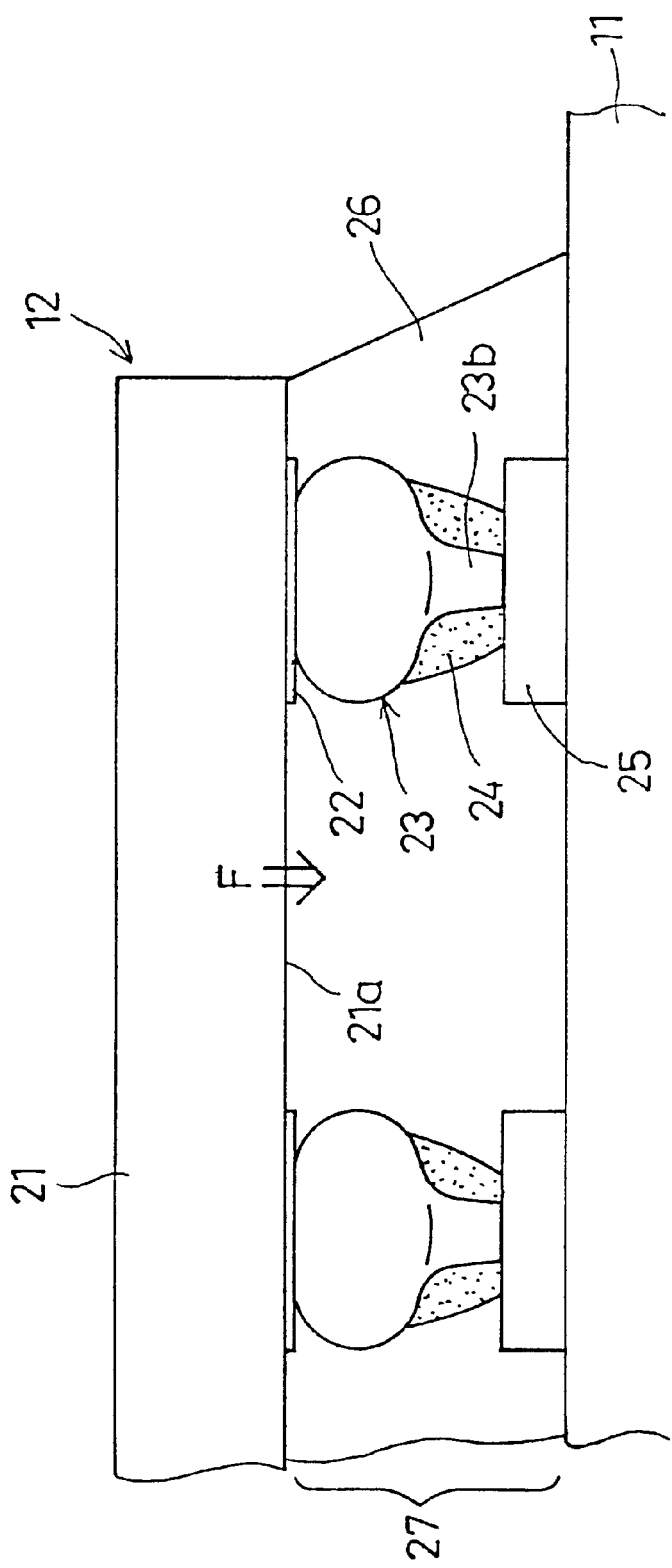
FIG. 8 is a diagram of one of the bare chips after the bare chip is mounted on the board.

FIG. 8 shows one of the bare chips after the bare chip is mounted on the board 11 in the multichip package module 10. In FIG. 8, for the purpose of illustration, an enlarged view of a portion of the multichip package module 10 is given.

As shown in FIG. 8, a plurality of electrodes 25 are provided on the printed-circuit board 11. The bare chip 12, indicated as one of the bare chips 12-1 through 12-4, is bonded to the board 11. By using the thermocompression connection of the flip-chip bonding technique, the stud bumps 23 are crimped onto the board 11, and the leg portions 23b are respectively bonded to the electrodes 25 on the board 11 by the conductive adhesive 24.

Further, an internal space 27 between the substrate 21 and the board 11 is filled with a thermosetting adhesive 26. The thermosetting adhesive 26 is, for example, an epoxy-type thermosetting adhesive. By the thermocompression connection of the flip-chip bonding technique, the thermosetting adhesive 26 is cured so that the entire bottom surface 21a of the substrate 21 is bonded to the board 11. Since the thermosetting adhesive 26 constricts when it is cured, a compressive force toward the board 11 is exerted on the bottom surface 21a of the substrate 21 as indicated by the arrow "F" in FIG. 8. Thus, the thermosetting adhesive 26 serves to firmly bond the leg portions 23b of the stud bumps 23 of the bare chip 12 to the electrodes 25 on the board 11.

Hereinafter, the method or the manner of mounting the bare chip on the printed-circuit board, as shown in FIG. 8, will be called the flip-chip bonding.

In view of the above-described multichip package module, a description will now be given of a preferred embodiment of a multichip package module production method of the present invention with reference to FIG. 2 through FIG. 5.

Figure 1A:
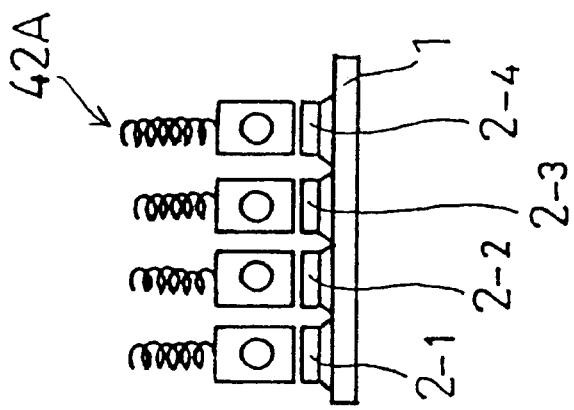
FIG. 1A through FIG. 1C are diagrams for explaining a conventional production method of a multichip package module.
Figure 1B:
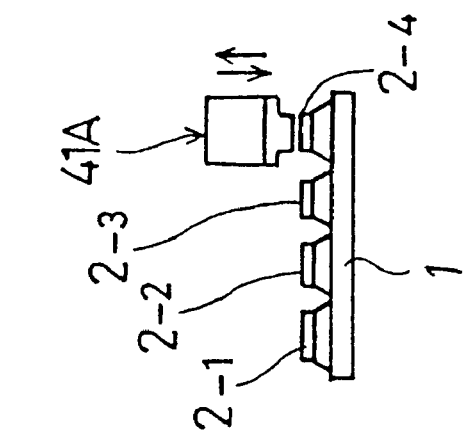
Figure 1C:
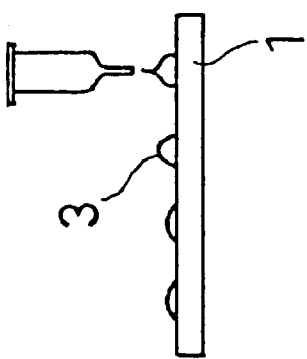
Figure 2:
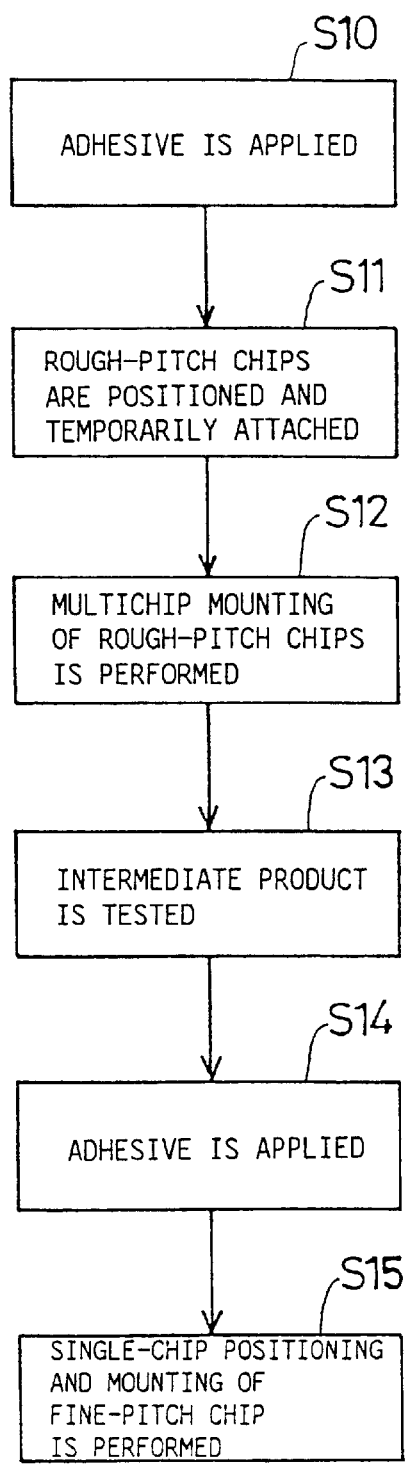
FIG. 2 is a flowchart for explaining a method of producing a multichip package module according to the present invention.

FIG. 2 is a flowchart for explaining one embodiment of a multichip package module production method of the present invention. FIG. 3A through FIG. 3F are diagrams for explaining respective steps of the multichip package module production method of FIG. 2.

Figure 3A:
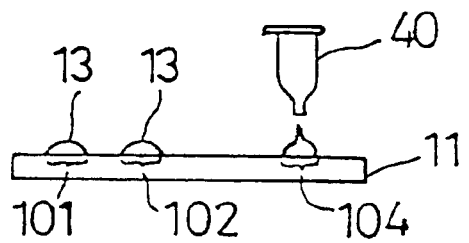
FIG. 3A through FIG. 3F are diagrams for explaining steps of the multichip package module production method of FIG. 2.
Figure 3B:
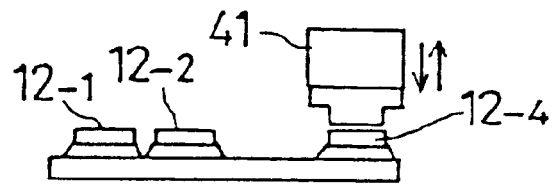
Figure 3C:
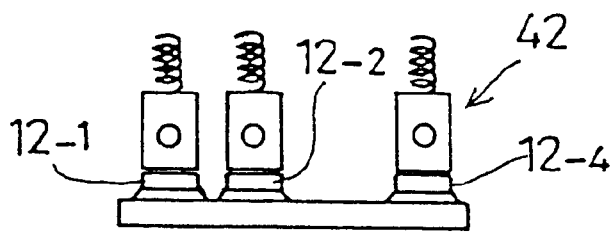
Figure 3D:
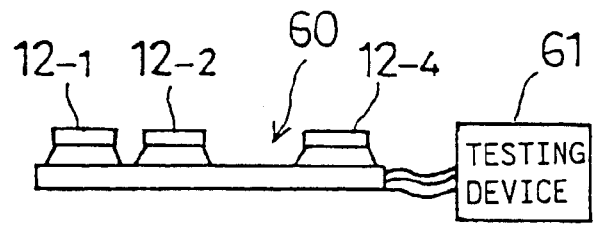
Figure 3E:
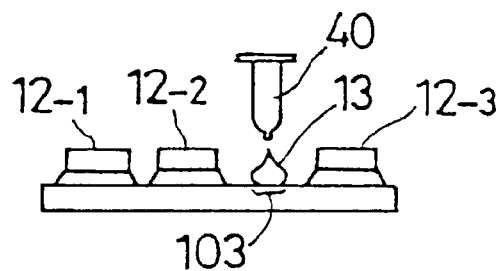
Figure 3F:
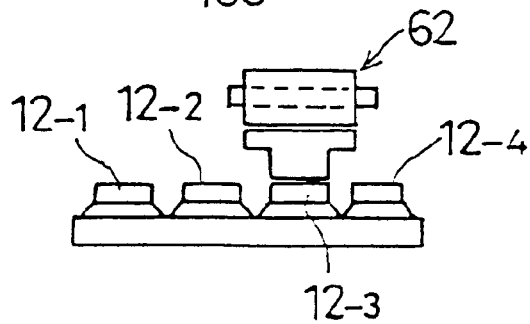

In the present embodiment, a multichip package module which is similar to the multichip package module 10 of FIG. 6 is produced by using the flip-chip bonding technique. In FIG. 2 through FIG. 3F, the elements which are the same as corresponding elements in FIG. 6 through FIG. 8 are designated by the same reference numerals, and a description thereof will be omitted.

Of the bare chips mounted on the board 11 in the multichip package module in the present embodiment, the bare chips 12-1, 12-2 and 12-4 are the rough-pitch bare chips, and the bare chip 12-3 is the fine-pitch bare chip. The fine-pitch bare chip 12-3 has a relatively small pitch "P2" between the stud bumps 23, and the pitch "P2" in this embodiment is in a range of 60–85 μm. The rough-pitch bare chips 12-1, 12-2 and 12-4 have a relatively large pitch "P1" between the studs bumps 23, and the pitch "P1" in this embodiment is in a range of 120–150 μm. Further, the fine-pitch bare chip 12-3 is expensive, and the rough-pitch bare chips 12-1, 12-2 and 12-4 are less expensive.

In the production method of the present embodiment, the rough-pitch bare chips 12-1, 12-2 and 12-4 and the fine-pitch bare chip 12-3 in combination are mounted on the board 11 by performing steps S10 through S15 shown in FIG. 2, in order to produce a multichip production module by using the flip-chip bonding technique.

As shown in FIG. 2, in the production method of the present embodiment, step S10 performs an adhesive application. As shown in FIG. 3A, in step S10, an adhesive dispenser 40 is controlled to apply an adhesive 13 to locations 101, 102 and 104 for the rough-pitch bare chips 12-1, 12-2 and 12-4 on a printed-circuit board 11. The locations to which the adhesive 13 is applied are predetermined as the positions of the rough-pitch bare chips 12-1, 12-2 and 12-4 being subsequently mounted on the board 11.

Step S11 performs a positioning and temporary attachment of the rough-pitch bare chips 12-1, 12-2 and 12-4 to the board 11. As shown in FIG. 3B, a vacuum head 41 is controlled to individually position the rough-pitch bare chips 12-1, 12-2 and 124 at the locations 101, 102 and 104 of the adhesive 13 on the board 11. The vacuum head 41 attracts a related one of the rough-pitch bare chips 12-1, 12-2 and 12-4 by evacuating an internal space between the vacuum head 41 and the related chip, and is capable of positioning the related chip to one of the locations 101, 102 and 104 on the board 11. Each time one of the rough-pitch bare chips 12-1, 12-2 and 12-4 is positioned, the vacuum head 41 applies a compressive force to the related one of the rough-pitch bare chips 12-1, 12-2 and 12-4 against the board 11. In this manner, the rough-pitch bare chips 12-1, 12-2 and 12-4 are temporarily attached to the board 11 by the adhesive 13 at the locations 101, 102 and 104 one by one.

Figure 4:
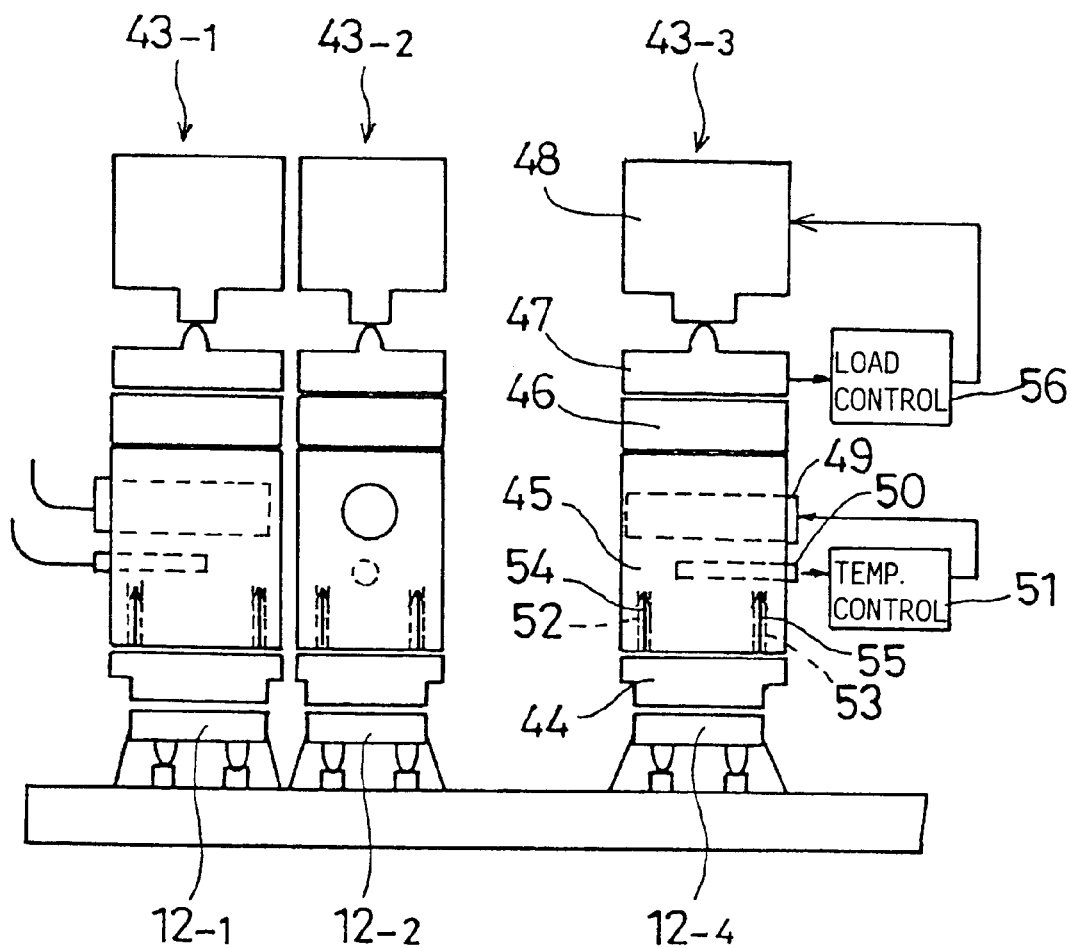
FIG. 4 is a diagram for explaining a construction of a multichip mounting machine.

Step S12 performs a multichip mounting of the rough-pitch bare chips 12-1, 12-2 and 12-4 on the board 11 by controlling a multichip mounting machine 42. The multichip mounting machine 42 is shown in FIG. 4 and will be described later. As shown in FIG. 3C, the multichip mounting machine 42 is controlled to simultaneously apply heat and pressure to the rough-pitch bare chips 12-1, 12-2 and 12-4 on the board 11 for about 100 seconds at a time. As described above, the thermocompression connection of the flip-chip bonding technique is used. The adhesive 13 at the locations 101, 102 and 104 provided between the rough-pitch bare chips 12-1, 12-2 and 12-4 and the board 11 are thermally cured by the heat applied by the multichip mounting machine 42. At the same time, the stud bumps 23 of the rough-pitch bare chips 12-1, 12-2 and 12-4 are crimped onto the board 11 by the compressive force by the multichip mounting machine 42. The rough-pitch bare chips 12-1, 12-2 and 12-4 are mounted on the board 11 in the same condition as the condition shown in FIG. 8. Accordingly, the multichip mounting step S12 results in an intermediate product of the multichip package module 10 in which only the rough-pitch bare chips 12-1, 12-2 and 12-4 are mounted on the board 11.

FIG. 4 shows a construction of the multichip mounting machine 42 used in the multichip package module production method of the present embodiment.

As shown in FIG. 4, the multichip mounting machine 42 has a plurality of thermocompression heads 43-1, 43-2 and 43-3 which correspond to the rough-pitch bare chips 12-1, 12-2 and 12-4 on the board 11. The thermocompression heads 43-1, 43-2 and 43-3 have a substantially identical construction, and each of the thermocompression heads 43-1, 43-2 and 43-4 includes a bonding head 44, a heating/vacuum head 45, a heat insulation block 46, a load sensor 47, and an air cylinder 48.

In the multichip mounting machine 42 of FIG. 4, a heater 49 and a temperature sensor 50 are provided in the heating/vacuum head 45. A temperature control unit 51 is connected at one end to an output of the temperature sensor 50 and connected at the other end to an input of the heater 49. The temperature control unit 51 controls the heating/vacuum head 45 in response to a detected temperature output by the temperature sensor 50 such that the heating/vacuum head 45 is retained at a predetermined high temperature.

In the multichip mounting machine 42 of FIG. 4, the heating/vacuum head 45 has a bottom portion in which a plurality of suction holes 52 and 53 are provided, and the bonding head 44 is attracted by the heating/vacuum head 45, as indicated by the arrows 54 and 55 in FIG. 4, by subjecting the inside spaces of the suction holes 52 and 53 to a vacuum generated by the air cylinder 48. Further, a load control unit 56 is connected at one end to an output of the load sensor 47 and connected at the other end to an input of the air cylinder 48. The load control unit 56 controls the air cylinder 48 in response to a detected load output by the load sensor 47 such that an attracting force of the vacuum generated by the air cylinder 48 is maintained at a predetermined controlled level.

Referring to FIG. 2, step S13 performs a testing of the intermediate product in the step S12. As shown in FIG. 3D, a testing device 61 is connected to the intermediate product. The testing device 61 is controlled to determine whether electric connections between the rough-pitch bare chips 12-1, 12-2 and 12-4 and the board 11 in the intermediate product are in conformity with predetermined testing requirements.

When the electric connections of all the rough-pitch bare chips 12-1, 12-2 and 12-4 to the board 11 are determined to be in conformity with the testing requirements, the intermediate product is accepted as the conforming product and it is transported to a following step of the production method of the present embodiment. On the other hand, when the electric connection of any of the rough-pitch bare chips 12-1, 12-2 and 12-4 to the board 11 is determined not to be in conformity with the testing requirements, the intermediate product is rejected as the non-conforming product and it is transported to a repair process or diverted from the conforming product flow.

The non-conforming product at the result of the testing step S13 will be eliminated. However, the rough-pitch bare chips 12-1, 12-2 and 12-4 are less expensive than the fine-pitch bare chip 12-3. The waste of the intermediate product at the result of the step S13 costs little since the expensive fine-pitch bare chip 12-3 is not yet mounted on the board 11.

Next, step S14 performs an adhesive application. As shown in FIG. 3E, in step S14, the adhesive dispenser 40 is used to apply the adhesive 13 to a location 103 for the fine-pitch bare chip 12-3 on the board 11 in the conforming intermediate product. The location to which the adhesive 13 is applied is predetermined as the position of the fine-pitch bare chip 12-3 being subsequently mounted on the board 11.

Figure 5:
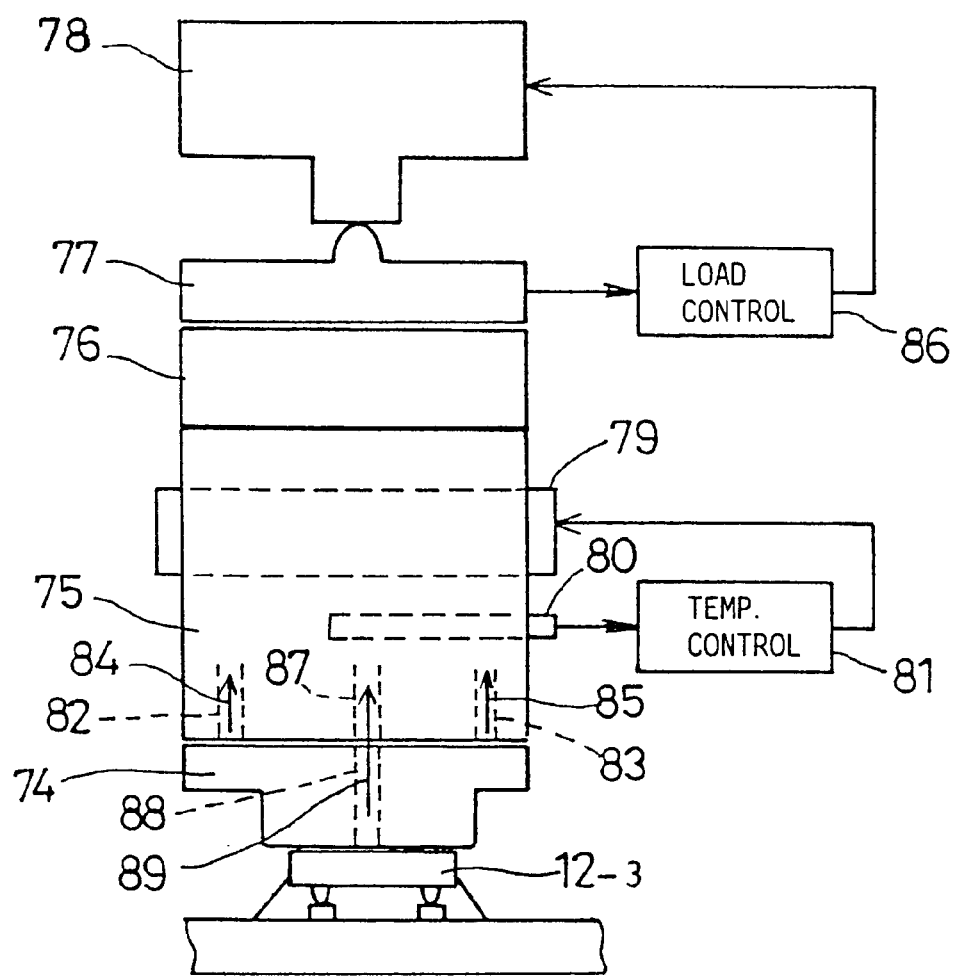
FIG. 5 is a diagram for explaining a construction of a single-chip mounting machine.

Finally, step S15 performs a single-chip positioning and mounting of the fine-pitch bare chip 12-3 on the board 11 by using a single-chip mounting machine 62. The single-chip mounting machine 62 is shown in FIG. 5 and will be described later. As shown in FIG. 3F, the single-chip mounting machine 62 is used to position the fine-pitch bare chip 12-3 at the location 103 of the adhesive 13 on the board 11 and to apply heat and pressure to the chip 12-3 on the board 11 for about 100 seconds at a time. The thermocompression connection of the flip-chip bonding technique is used for the single-chip mounting. The adhesive 13 at the location 103 provided between the fine-pitch bare chip 12-3 and the board 11 is thermally cured by the heat applied by the single-chip mounting machine 62. At the same time, the stud bumps 23 of the fine-pitch bare chip 12-3 are crimped onto the board 11 by the compressive force by the single-chip mounting machine 62. The fine-pitch bare chip 12-3 is mounted on the board 11 in the same condition as the condition shown in FIG. 8. Accordingly, the single-chip positioning and mounting step S15 results in the multichip package module 10 in which the rough-pitch bare chips 12-1, 12-2 and 12-4 and the fine-pitch bare chip 12-3 in combination are mounted on the board 11 as shown in FIG. 6.

FIG. 5 shows a construction of the single-chip mounting machine 62 used in the multichip package module production method of the present invention.

As shown in FIG. 5, the single-chip mounting machine 62 has a single thermocompression head which corresponds to the fine-pitch bare chip 12-3 on the board 11. This thermocompression head is essentially the same as one of the plurality of thermocompression heads 43-1, 43-2 and 43-3 in the multichip mounting machine 42 except that a suction hole 87 is provided in the middle of a heating/vacuum head 75 and a suction hole 88 is provided in the middle of a bonding head 74.

The thermocompression head of the single-chip mounting machine 62 includes the bonding head 74, the heating/vacuum head 75, a heat insulation block 76, a load sensor 77, and an air cylinder 78.

In the single-chip mounting machine 62 of FIG. 5, a heater 79 and a temperature sensor 80 are provided in the heating/vacuum head 75. A temperature control unit 81 is connected at one end to an output of the temperature sensor 80 and connected at the other end to an input of the heater 79. The temperature control unit 81 controls the heating/vacuum head 75 in response to a detected temperature output by the temperature sensor 80 such that the heating/vacuum head 75 is retained at a predetermined high temperature.

In the single-chip mounting machine 62 of FIG. 5, the heating/vacuum head 75 has a bottom portion in which a plurality of suction holes 82 and 83 are provided, and the bonding head 74 is attracted by the heating/vacuum head 75, as indicated by the arrows 84 and 85 in FIG. 5, by subjecting the inside spaces of the suction holes 82 and 83 to a vacuum generated by the air cylinder 78. Further, a load control unit 86 is connected at one end to an output of the load sensor 77 and connected at the other end to an input of the air cylinder 78. The load control unit 86 controls the air cylinder 78 in response to a detected load output by the load sensor 77 such that an attracting force of the vacuum generated by the air cylinder 78 is maintained at a predetermined controlled level.

As described above, in the single-chip mounting machine 62 of FIG. 5, the bonding head 74 includes the suction hole 88 provided in the middle of the bonding head 74, and the heating/vacuum head 75 includes the suction hole 87 provided in the middle of a heating/vacuum head 75, the suction hole 87 communicating with the suction hole 88. The fine-pitch bare chip 12-3 is attracted by the bonding head 74 by subjecting the inside spaces of the suction holes 87 and 88 to the vacuum generated by the air cylinder 78, as indicated by the arrow 89 in FIG. 5. The single-chip mounting machine 62 individually positions the fine-pitch bare chip 12-3 at the location 103 of the adhesive 13 on the board 11 and individually applies heat and pressure to the chip 12-3 on the board 11 for about 100 seconds at a time. The adhesive 13 at the location 103 provided between the fine-pitch bare chip 12-3 and the board 11 is thermally cured by the heat applied by the single-chip mounting machine 62. At the same time, the stud bumps 23 of the fine-pitch bare chip 12-3 are crimped onto the board 11 by the compressive force by the single-chip mounting machine 62. The fine-pitch bare chip 12-3 is mounted on the board 11 in the same condition as the condition shown in FIG. 8. Accordingly, the multichip package module 10 in which the rough-pitch bare chips 12-1, 12-2 and 12-4 and the fine-pitch bare chip 12-3 in combination are mounted on the board 11 is produced.

According to circumstances, the above-described testing step S13 in the multichip package module production method of the present embodiment may be omitted.

In the above step S15 of the present embodiment, only one fine-pitch bare chip 12-3 is mounted on the board 11 by using the single-chip mounting machine 62. The present invention is not limited to the above-described embodiment. It is possible that, in the single-chip mounting step S15 of the production method of the present invention, a plurality of fine-pitch bare chips are individually mounted on the board 11 by using the single-chip mounting machine 62 for a respective one of the plurality of fine-pitch bare chips.

Further, the present invention is not limited to the above-described embodiment, and variations and modifications may be made without departing from the scope of the present invention.

What is claimed is:

1. A method of producing a multichip package module in which rough-pitch bare chips having a first pitch between bumps and fine-pitch bare chips having a second pitch between bumps smaller than the first pitch in combination are mounted on a printed-circuit board by using a flip-chip bonding technique, said method comprising the steps of:

positioning the rough-pitch bare chips at first locations on the board and temporarily attaching the rough-pitch bare chips to the board at the first locations;

mounting the rough-pitch bare chips on the board at the same time; and after said step of mounting the rough pitch bare chips on the board, positioning a respective one of the fine-pitch bare chips at a respective one of second locations on the board other than the first locations, and mounting the respective one of the fine-pitch bare chips on the board.

2. The method according to claim 1, wherein said method further comprises a step of:

testing an intermediate product in which only the rough-pitch bare chips are mounted on the board as a result of said step of mounting of the rough-pitch bare chips, in order to determine whether electric connections between the rough-pitch bare chips and the board are in conformity with predetermined testing requirements.

3. The method according to claim 2, wherein said step of positioning and mounting the fine-pitch bare chips is performed only when the electric connections between the rough-pitch bare chips and the board in the intermediate product are determined to be in conformity with the predetermined testing requirements as a result of said step of testing.

4. The method according to claim 1, wherein the rough-pitch bare chips and the fine-pitch bare chips have stud bumps provided thereon, said stud bumps being bonded to the board when applying heat and pressure to the rough-pitch bare chips and the fine-pitch bare chips.

5. The method according to claim 1, wherein said step of positioning the rough-pitch bare chips controls a vacuum head, said vacuum head attracting a related one of the rough-pitch bare chips by evacuating an internal space between the vacuum head and the related chip, and said vacuum head positioning the related chip to one of the first locations on the board.

6. The method according to claim 1, wherein said step of mounting the rough-pitch bare chips controls a multichip mounting machine, said multichip mounting machine including a plurality of thermocompression heads, the plurality of thermocompression heads being respectively provided to the rough-pitch bare chips on the board.

7. The method according to claim 1, wherein said step of positioning and mounting the respective one of the fine-pitch bare chips controls a single-chip mounting machine, said single-chip mounting machine including a single thermocompression head, said thermocompression head being provided to one of the fine-pitch bare chips on the board.

8. The method according to claim 1, wherein said step of positioning and mounting the fine-pitch bare chips controls a single-chip mounting machine, said single-chip mounting machine including a bonding head, said bonding head attracting a related one of the fine-pitch bare chips by evacuating an internal space between the bonding head and the related chip, and said bonding head positioning the related chip to one of the second locations on the board.

9. The method according to claim 1, wherein said step of positioning and mounting the fine-pitch bare chips controls a single-chip mounting machine, said single-chip mounting machine including a thermocompression head, said thermocompression head being capable of positioning and mounting a related one of the fine-pitch bare chips.

10. The method according to claim 1, wherein the fine-pitch bare chips have a relatively small pitch between stud bumps provided thereon, and the rough-pitch bare chips have a relatively large pitch between stud bumps provided thereon.

11. A method of producing a multichip package module in which a plurality of rough-pitch bare chips having a first pitch between bumps and a fine-pitch bare chip having a second pitch between bumps smaller than the first pitch are mounted on a printed-circuit board, said method comprising the steps of:

(a) positioning the rough-pitch bare chips at first locations on the board and mounting the plurality of rough-pitch bare chips on the board; and (b) after said step (a), positioning the fine-pitch bare chip at a second location on the board and mounting the fine-pitch bare chip on the board.

12. A method according to claim 11, further comprising the step of testing an intermediate product in which only the rough-pitch bare chips are mounted on the board as a result of said step (a) of positioning and mounting the rough-pitch bare chips, in order to determine whether electric connections between the rough-pitch bare chips and the board are in conformity with predetermined testing requirements.

13. A method according to claim 12, wherein said step (b) of positioning and mounting the fine-pitch bare chip is performed only when the electric connections between the rough-pitch bare chips and the board in the intermediate product are determined to be in conformity with the predetermined testing requirements as a result of said step of testing.

14. A method according to claim 11, wherein said positioning of the rough-pitch bare chips controls a vacuum head to attract the rough-pitch bare chips by evacuating an internal space between the vacuum head and the rough-pitch chips.

15. A method according to claim 11, wherein said positioning of the fine-pitch bare chip controls a vacuum head to attract the fine-pitch bare chip by evacuating an internal space between the vacuum head and the fine-pitch chip.

16. A method according to claim 11, wherein said mounting of the rough-pitch bare chips and said mounting of the fine-pitch bare chip bonds stud bumps, provided on the rough-pitch bare chips and the fine-pitch bare chip, to the board when applying heat and pressure.

17. A method according to claim 11, wherein the fine-pitch bare chip has a relatively small pitch between stud bumps, and the rough-pitch bare chips have a relatively large pitch between stud bumps.

* * * * *